(12) United States Patent
Martin et al.

(10) Patent No.: US 6,704,206 B2
(45) Date of Patent: Mar. 9, 2004

(54) ASSEMBLY DEVICE AND METHOD FOR ASSEMBLING AN ELECTRONIC COMPONENT

(75) Inventors: Norbert Martin, Ottersweier (DE); Christoph Ruf, Eningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/119,583

(22) Filed: Apr. 10, 2002

(65) Prior Publication Data

US 2003/0030136 A1 Feb. 13, 2003

(30) Foreign Application Priority Data

Apr. 10, 2001 (DE) .......................................... 101 17 797

(51) Int. Cl.$^7$ ................................................ H05K 7/02
(52) U.S. Cl. .................. 361/760; 361/759; 361/707; 361/715; 361/716
(58) Field of Search ......................... 361/759–760, 361/715–716, 707

(56) References Cited

U.S. PATENT DOCUMENTS 5,898,575 A * 4/1999 Hawthorne et al. ......... 361/809
5,974,654 A   11/1999 Morita

FOREIGN PATENT DOCUMENTS

| DE | 36 25 038 | 1/1988 |
|----|-----------|--------|
| DE | 42 34 837 | 4/1994 |
| EP | 0 685 990 | 12/1995 |
| JP | 53099875 | 8/1978 |
| JP | 11112121 | 4/1999 |
| WO | WO 98/15005 | 4/1998 |

* cited by examiner

*Primary Examiner*—David L. Talbott
*Assistant Examiner*—Luan Thai
(74) *Attorney, Agent, or Firm*—Kenyon & Kenyon

(57) ABSTRACT

An assembly device for an electronic component in sandwich type of construction. The electronic component includes at least one semiconductor element which is contacted in a planar fashion on its lower side and its upper side each by one circuit substrate. Using the assembly device, the two circuit substrates may be simply adjusted with respect to each other during assembly of the electronic component. For this, the assembly device includes a first lower shell including an accommodation for the first of the two circuit substrates, an arrangement for the defined alignment of the first circuit substrate in the accommodation, and a second, upper shell including an arrangement for adjusting the second circuit substrate positioned on the semiconductor element. A method for assembling an electronic component in sandwich type of construction, using such an assembly device, is also described.

5 Claims, 1 Drawing Sheet

ASSEMBLY DEVICE AND METHOD FOR ASSEMBLING AN ELECTRONIC COMPONENT

FIELD OF THE INVENTION

The present invention relates to an assembly device for an electronic component. The electronic component includes at least one semiconductor element which is contacted in a planar manner by a circuit substrate on each its lower side and its upper side. The present invention also relates to a method for assembling such an electronic component using such an assembly device.

BACKGROUND INFORMATION

Many power semiconductors have to be electrically contacted both on their structured upper side and their lower side. The electrical contacting of the lower side is generally accomplished by a so-called "die attach" process. Here, the semiconductor is mounted by soldering or adhesive bonding to an electrically conductive support, such as a substrate, a cooling element or a pressed screen. The contacting of the upper side is usually done by a wire bonding process. In this connection, aluminum wires, for example, are fastened to the semiconductor element by ultrasound welding, continued to the electrically conductive support, and fastened there likewise by a wire bonding process.

For currents to be switched in power electronics, three to six bonding bridges have to be installed per semiconductor element. This is connected, on the one hand, with the considerable use of space for the bonding lands on the semiconductor element, and on the other hand, with a relatively high fault liability or failure rate. In addition, in the case of aluminum wire bonding, a single connection process is involved, which leads to considerable process times in the production of such electronic components, e.g., in the case of mass production. Finally, it should be mentioned that bonding bridges in power electronics cause leakage inductance that are not to be neglected.

In International Published Patent Application No. WO 98/15005 a sandwich construction method is described for electronic components which make do without the bonding bridges described above. For this purpose, the power semiconductor is contacted on its lower side and its upper side by a circuit substrate in a planar fashion.

The two circuit substrates should be oriented parallel to each other with the lowest possible tolerances for both the production of such an electronics component and its installation in equipment. The adjustment of the two circuit substrates required for this turns out to be a problem in practice.

SUMMARY OF THE INVENTION

The present invention relates to an assembly device for an electronic component in a sandwich type of construction, the use of which the two circuit substrates of the electronic component may be simply adjusted to each other.

The assembly device according to the present invention includes a first lower shell including an accommodation for the first of the two circuit substrates, an arrangement for the defined aligning of the first circuit substrate in the accommodation, and a second, upper shell including an arrangement for adjusting the second circuit substrate positioned on the semiconductor element.

The present invention also relates to a method for assembling such an electronic component using such an assembly device.

According to the present invention, the first circuit substrate is positioned in the accommodation of the first shell, and is aligned in a defined manner by using adjusting pins, which project from the side wall of the accommodation, and at least one correspondingly arranged and supported positioning pin in the x and the y direction, i.e., in the plane of the first circuit substrate. The semiconductor element is positioned on the first circuit substrate, and the second circuit substrate is positioned above the semiconductor element on top of the first shell. Then the first circuit substrate is aligned in a defined manner with the aid of adjusting pins, which project from the bottom wall of the accommodation, and at least two holding-down clamps in the z direction, i.e., perpendicular to the plane of the first circuit substrate. The second circuit substrate is adjusted in the x and the y direction in that adjusting pins arranged on the second shell are guided through indexing holes in the second circuit substrate and positioned in corresponding recesses in the first shell. The second circuit substrate is adjusted in the z direction in that the first Shell and the second shell are pressed against each other.

The assembly device according to the present invention may be used not only for mutual adjustment of the two circuit substrates to each other, but also as workpiece support during connecting processes, such as soldering or bonding.

The assembly device according to the present invention and the method according to the present invention may make possible not only a simple, and precise adjustment of the two circuit substrates of an electronic component constructed by sandwich type of construction, but also an individual development of the electronic component in regard to its dimensions and its outer shape. Thus, an electronic component constructed using the arrangement of the present invention may simply and in a secure process be molded or hermetically sealed, depending on the type of its final mounting location. It may also be possible to configure the electronic component, with respect to its dimensions, in accordance with SAT (surface mount technology) type, laid down in the international norm for standardized plastic packaging of electronic components, GATWICK-95. The back end production process is identical to the manufacturing of a standardized power housing. For further processing, then, the processes usually employed are available, such as surface mounting technique, or SAT. But beyond that, circuit substrates may be used whose geometry makes possible another kind of assembly of the electronic component. Thus, the assembly device according to the present invention is especially suitable for adjusting circuit substrates in the form of pressed screens. By inner and/or outer fusing of the connecting crosspieces of such pressed screens, the most varied geometries may be produced which, for example, permit assembly by using soldering, welding, riveting or by screws.

There are different possibilities for realizing the example embodiment of the assembly device and the implementation of the method according to the present invention. In this context, reference is made to the following description of an example embodiment of the present invention on the basis of the drawing.

DETAILED DESCRIPTION

Figure 1:
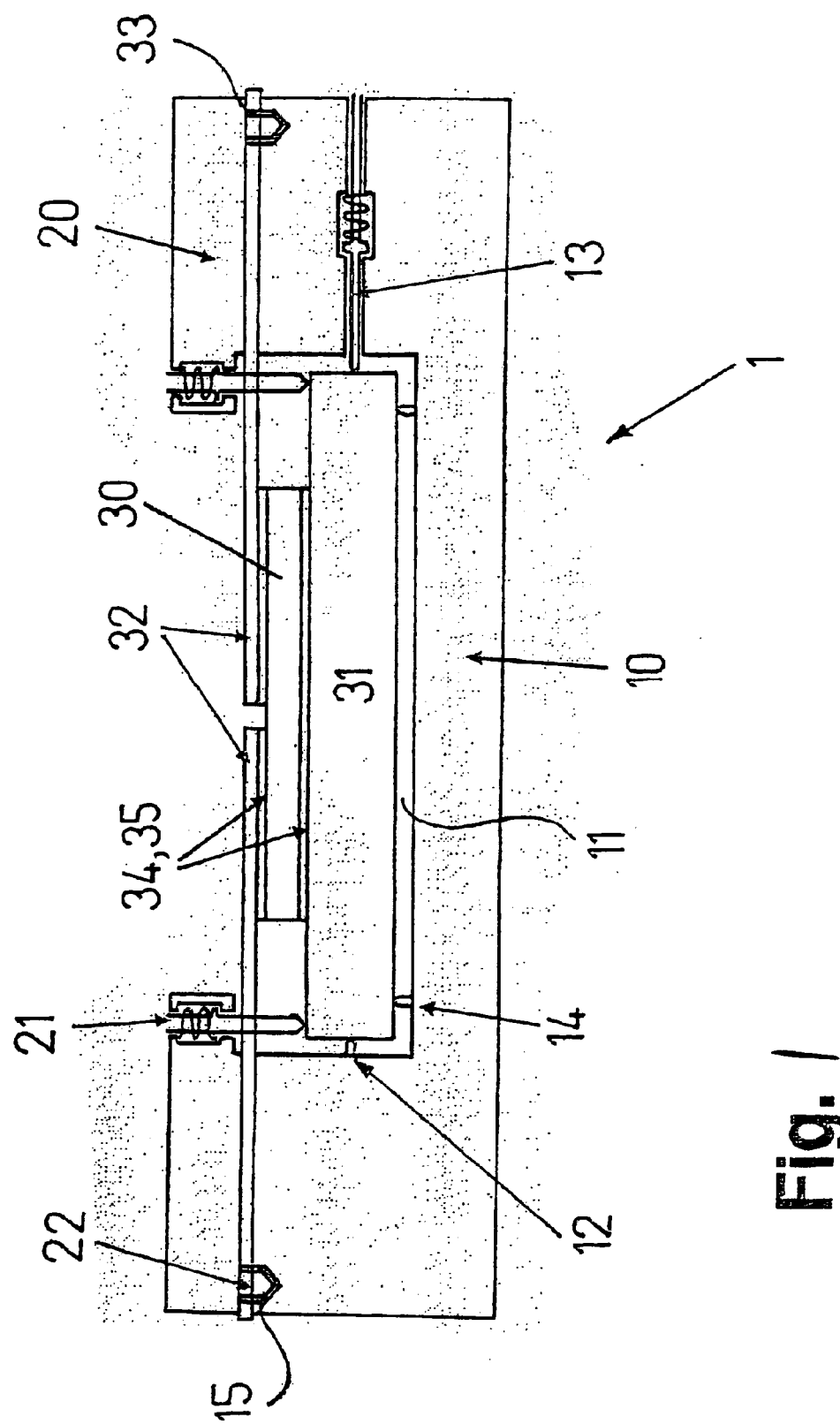
FIG. 1 is a cross-sectional view through an assembly device according to the present invention.

In the assembly device illustrated in FIG. 1, an assembly device for an electronic component is involved, including at least one semiconductor element 30 which is contacted in a planar manner on its lower side and on its upper side respectively by one circuit substrate 31 and 32. The development of such an electronic component in sandwich type of construction is explained in greater detail below, in connection with assembly device 1.

Assembly device 1 includes a first lower shell 10 including an accommodation 11 for the first of the two circuit substrates 31. Furthermore, an arrangement for defined alignment of first circuit substrate 31 in accommodation 11 may be provided. Finally, assembly device 1 also includes a second, upper shell 20 including an arrangement for adjusting second circuit substrate 32 positioned on semiconductor element 30.

For the purpose of aligning first circuit substrate 31, positioned in accommodation 11, in the x and the y direction, i.e. in the plane of first circuit substrate 31, a plurality of first adjusting pins 12 may be provided, of which only one is illustrated here. First adjusting pins 12 project from the sidewall of accommodation 11. Two positioning pins 13 may also be provided, of which only one is illustrated here. Positioning pins 13 are arranged in first shell 10 and supported in such a manner that they press first circuit substrate 31 against first adjustment pins 12. For this purpose, positioning pins 13 may be supported, for example, flexibly or by a screw thread.

For the alignment of first circuit substrate 31 in the z direction, that is, perpendicularly to the plane of first circuit substrate 31, a plurality of second adjustment pins 14 may be provided, which project from the bottom wall of accommodation 11. Several holding-down clamps 21 are arranged in second shell 20 and supported in such a manner that they press first circuit substrate 31 against first adjustment pins 14. Just like positioning pins 13, holding-down clamps 21 may be supported flexibly or by a screw thread.

For adjusting second circuit substrate 32 positioned on semiconductor element 30, second shell 20 includes at least two adjusting pins 22 which are guided through indexing holes 33, furnished for this purpose in second circuit substrate 32, and are positioned in corresponding recesses 15 of first shell 10. The adjustment of second circuit substrate 32 in the x/y direction is made with the aid of adjusting pins 22.

For the adjustment of second circuit substrate 32 in the z direction, an arrangement may be provided for pressing first shell 10 against second shell 20, e.g., for screwing first shell 10 to second shell 20.

As was mentioned before, the two circuit substrates of an electronic component produced in sandwich type of production may be implemented in the form of pressed screens.

Within the framework of the method according to the present invention, lower pressed screen 31 is then first set into accommodation 11 of the first shell. With the aid of first adjusting pins 12, which project from the sidewall of accommodation 11. With the aid of the two positioning pins 13 lower pressed screen 31 is aligned in a defined manner in the x and the y direction.

For the "die attach" process, lower pressed screen 31 is furnished with a suitable connecting arrangement 34, such as soldering paste or adhesive. A stencil printing method may be used for this, before pressed screen 31 is set into accommodation 11 of lower shell 10. However, the lower pressed screen may also be furnished with connecting arrangement 34 after it is laid into accommodation 11 of lower shell 10, for instance, by the dispensing of soldering paste. Subsequently, semiconductor element 30 is positioned on lower pressed screen 31. Connecting arrangement 35 between semiconductor element 30 and upper pressed screen 32 may either be applied on the upper side of semiconductor element 30 or on the lower side of upper pressed screen 32. In the first case mentioned, the connecting arrangement 35 is applied to the surface of semiconductor element 30 before positioning semiconductor element 30.

Upper pressed screen 32 is laid down on semiconductor element 30 and lower shell 10. Upper pressed screen 32 must be developed so that the surfaces to be contacted in the x and the y direction lie exactly above the surfaces of semiconductor element 30 to be contacted. As an aid to adjusting, so-called indexing holes 33 are formed in upper pressed screen 32. The adjustment of upper pressed screen 32 in the x and the y direction is made with the aid of adjusting pins 22 arranged on the upper shell, which engage via indexing holes 33 with corresponding recesses 15 of first shell 10.

The aligning of lower pressed screen 31 in the z direction is performed only after the positioning of upper pressed screen 32 on semiconductor element 30 and lower shell 10 with the aid of holding-down clamps 21 arranged on upper shell 20. These penetrate through upper pressed screen 32 and press lower pressed screen 31 against adjusting pins 14, which project from the bottom wall of accommodation 11 in first shell 10. The adjustment of upper pressed screen 32 in the z direction is made by pressing upper shell 20 to lower shell 10 or by screwing them together.

On account of the adjustment of the two pressed screens 31 and 32 in all three spatial directions, only semiconductor element 30 may move between pressed screens 31 and 32 after fusing of the solder or curing of the adhesive, respectively, which is noncritical, just as the positioning of semiconductor element 30 on lower pressed screen 31. Due to the surface tension of the liquid connecting arrangement, homogeneous connecting layers 34 and 35 develop, whose thickness depends in each case on how much material was applied.

The assembly device according to the present invention, and the method according to the present invention may make it possible to implement electronic components in sandwich type of construction, including two circuit substrates in the form of pressed screens and using soldering or adhesive bonding as the connecting process. The present invention makes available simple measures by which the two pressed screens may be adjusted to be parallel to each other during the connecting process. Such a parallel orientation of the two pressed screens having tolerances as low as possible is required, for instance, if the electronic component is to be molded after assembly and/or mounted in an electrical device for cooling on both sides.

With the aid of the assembly device according to the present invention, depending on the configuration of the two shells and especially on the accommodation in the lower shell, other defined orientations between the two circuit substrates of an electronic component may be implemented.

What is claimed is:

1. An assembly device for an electronic component, the electronic component including at least one semiconductor element which is contacted in a planar manner by a first circuit substrate on a lower side of the semiconductor element, and a second circuit substrate on an upper side of the semiconductor element, the assembly device comprising:

a first lower shell having an accommodation for the first circuit substrate;

a first arrangement for a defined alignment of the first circuit substrate in the accommodation; and a second upper shell including a second arrangement for adjusting the second circuit substrate positioned on the semiconductor element.

2. The assembly device according to claim 1, wherein the first arrangement includes:

a plurality of first adjusting pins projecting from the sidewall of the accommodation in a plane of the first circuit substrate, and at least one positioning pin arranged and supported so that the at least one position pin presses the first circuit substrate against the first adjusting pins.

3. The assembly device according to claim 2, wherein the first arrangement includes:

a plurality of second adjusting pins projecting from a bottom wall of the accommodation perpendicular to the plane of the first circuit substrate, and at least one holding-down clamp arranged and supported on the second shell so that the at least one holding-down clamp presses the first circuit substrate against the second adjusting pins.

4. The assembly device according to claim 1, wherein the second arrangement includes:

at least two adjusting pins arranged within the second shell, the at least two adjusting pins being guided through indexing holes provided in the second circuit substrate, and being arranged in corresponding recesses of the first shell.

5. The assembly device according to claim 1, further comprising:

an arrangement configured for pressing the first shell against the second shell for screwing the first shell to the second shell.

* * * * *